United States Patent [19]

Engel

[11] Patent Number: 4,572,103
[45] Date of Patent: Feb. 25, 1986

[54] SOLDER PASTE DISPENSER FOR SMD CIRCUIT BOARDS

[76] Inventor: Harold J. Engel, 18932 Olympia St., Northridge, Calif. 91326

[21] Appl. No.: 684,282

[22] Filed: Dec. 20, 1984

[51] Int. Cl.$^4$ .............................................. B05C 5/02
[52] U.S. Cl. ................................... 118/697; 118/410; 222/260
[58] Field of Search .................. 222/388, 260, 420; 118/697, 698, 410, 411, 243, 401

[56] References Cited

U.S. PATENT DOCUMENTS

| | | | |
|---|---|---|---|
| 2,567,201 | 9/1951 | Goepfert | 118/410 X |
| 3,731,648 | 5/1973 | Gerber et al. | 118/697 |
| 3,785,898 | 1/1974 | Gerber et al. | 118/697 X |

Primary Examiner—John P. McIntosh
Attorney, Agent, or Firm—Harvey S. Hertz

[57] ABSTRACT

A device for discretely controlled deposition of very small quantities of a viscous fluid at each of a succession of locations according to a digital X-Y-Z program. The primary application is for deposition of a slurry of small solder particles in a viscous fluid such as, for example, an organic acid RMA standard flux on a programmed succession of conductive pads or loci on or above the surface of a typical SMD circuit board.

A pumping valve driven by pneumatic pressure effects a uniform deposition during the dwell time at each location. A free-piston syringe driven by pneumatic pressure supplies the slurry to a chamber within the pumping valve barrel which feed a small orifice (such as from a hypodermic needle). A pancake pneumatic cylinder controls the up-down motion of a rod acting as a piston to drive the predetermined uniform amount of slurry through the orifice on its down-stroke, the up-stroke aiding in the formation of a "fluid-sheer" cone of the deposited viscous material.

18 Claims, 4 Drawing Figures

SOLDER PASTE DISPENSER FOR SMD CIRCUIT BOARDS

BACKGROUND OF THE INVENTION (1) Field of the Invention

The invention relates generally to devices for discrete, small-quantity depositions of viscous material and more specifically to controlled depositions over a succession of locations. Still more specifically, the invention relates to discrete and uniform deposition of a high viscosity slurry particles in a flux material on successive locations on an electronic circuit board under computer X-Y-Z control.

(2) Description of the Prior Art

Prior art systems of the general type for effecting very small depositions of viscous fluid have been constructed conventionally, i.e., using controlled pressure or application or valving of material under pressure applied through a very small orifice (commonly a hypodermic type needle). The very small orifice through which the material must be ejected in applications such as deposition of the solder paste slurry containing particles of solder creates a practical problem in obtaining uniformity over a number of locations on the surface of an electronic circuit board. Depositions on a so-called SMD (surface mounted device) boards of small size present a unique problem in this regard. This is at least partly because of the solid solder particles passing through the small needle orifice (typically 0.02 inches in diameter) of the hypodermic needle. That small needle orifice is necessary in order to obtain a deposition on the order of 0.030 inches in diameter at each location; however, if pressure against the slurry within the syringe feeding the needle is relied upon, a relatively high pressure is required, e.g., as much as 100 psi or more. Such a pressure tends to cause separation of the solder particles from the flux acting as a fluid vehicle resulting in variation in the solder flux/ratio. Moreover, bridging or jamming of the solder particles within the needle passage can partially or completely block the flow of the slurry. A slurry which includes minute spherical solder particles is commercially available and does partially alleviate this problem; however, it is much more expensive than the commercially available slurry having random solder particles or flakes up to a nominal size in the flux.

The computer programmed servo apparatus for X-Y-Z positioning is an element of the overall combination but is known per se and has been described in the patent literature, for example, in U.S. Pat. Nos. 3,731,648 and 3,785,898.

The manner in which the invention deals with the disadvantages of the prior art by providing a novel pumping valve system capable of uniform and consistent slurry deposition will be understood as this specification proceeds.

SUMMARY OF THE INVENTION

The invention comprises a system and a pumping valve arrangement therein. A syringe containing the solder/flux slurry or other viscous material is minimally pressurized to force the material through feed lines substantially larger than the needle passage into a cylinder chamber. A drive unit which may be a two-way air cylinder or an electric solenoid pushes a rod type piston within the cylinder chamber forcing the accumulated discrete volume of slurry therein out and through the connected hypodermic needle. Thus the slurry is forced out at whatever effective pressure develops during downward piston travel to insure freedom from clogging within the needle passage.

The pumping valve described herein facilitates the use of the less expensive flux slurry with random particles (flakes) of solder by providing enlarged passages between syringe and needle so that only moderate pressure (15-20 psi) is required to feed the pumping valve. Thereafter the pumping action drives the slurry through the needle.

The slurry may comprise the solder particles in an RMA standard organic acid flux or in some other known viscous flux material.

The system of the invention contemplates state of the art X-Y-Z digitally programmed positioning apparatus, as hereinabove identified.

BRIEF DESCRIPTION OF THE DRAWINGS

FIG. 2 depicts the details (magnified) of a typical embodiment of a pumping valve according to the invention.

DETAILED DESCRIPTION

Figure 1:
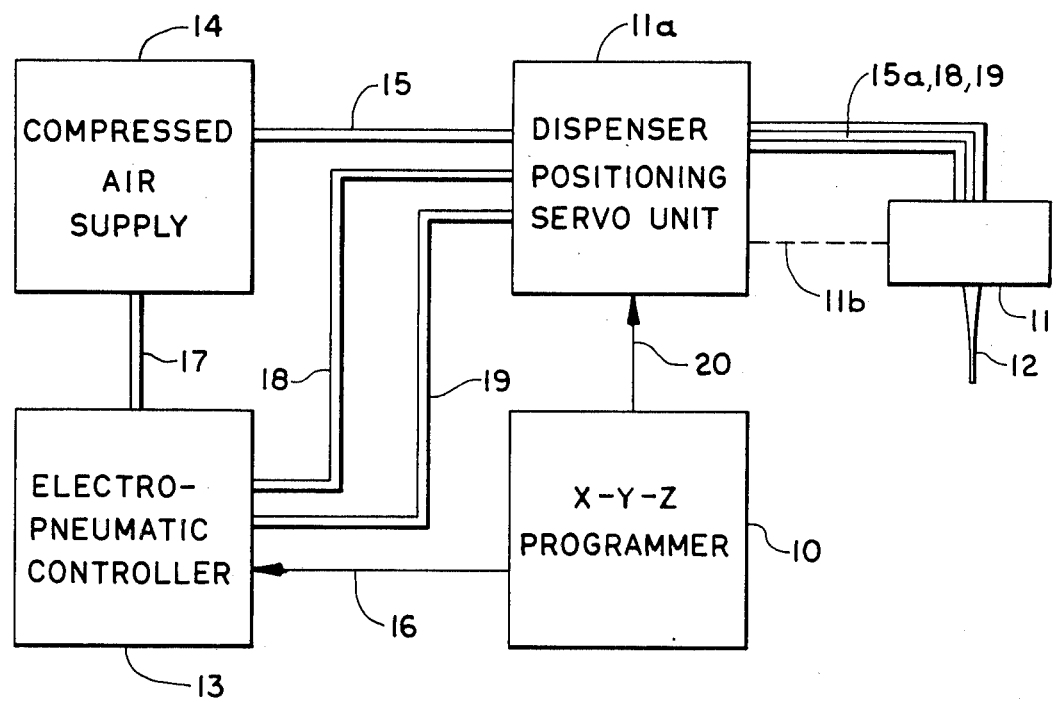
FIG. 1 is a functional block diagram of a typical dispensing system arrangement according to the invention.

Referring now to FIG. 1, a typical functional arrangement of the apparatus required for implementation of the invention into a useful system is shown. A conventional compressed air supply 14 supplies compressed air to the dispenser assembly 11 via air line 15 and 15a (shown passing through the dispenser positioning servo unit 11a, since mechanically, the positioning servo 11a positions the entire dispenser addembly 11. Similarly, the air hoses 18 and 19 emanate from the dispenser positioning servo unit 11a and flex with the positioning of the dispensing unit 11, the linkage 11b representing the mechanical connections required to effect the controlled positioning of unit 11. These hoses 18 and 19 are the up-down control lines to the "pancake" cylinder 38(FIG. 2), the functions of which will be understood as this description proceeds.

The positioning servo unit 11a and its X-Y-Z programmer are conventional in this art and may be substantially as disclosed in the patent literature, for example, in U.S. Pat. Nos. 3,731,648; 3,785,898 and in copending U.S. patent application Ser. No. 560,590 filed Dec. 12, 1983.

Figures 2A, 2B:
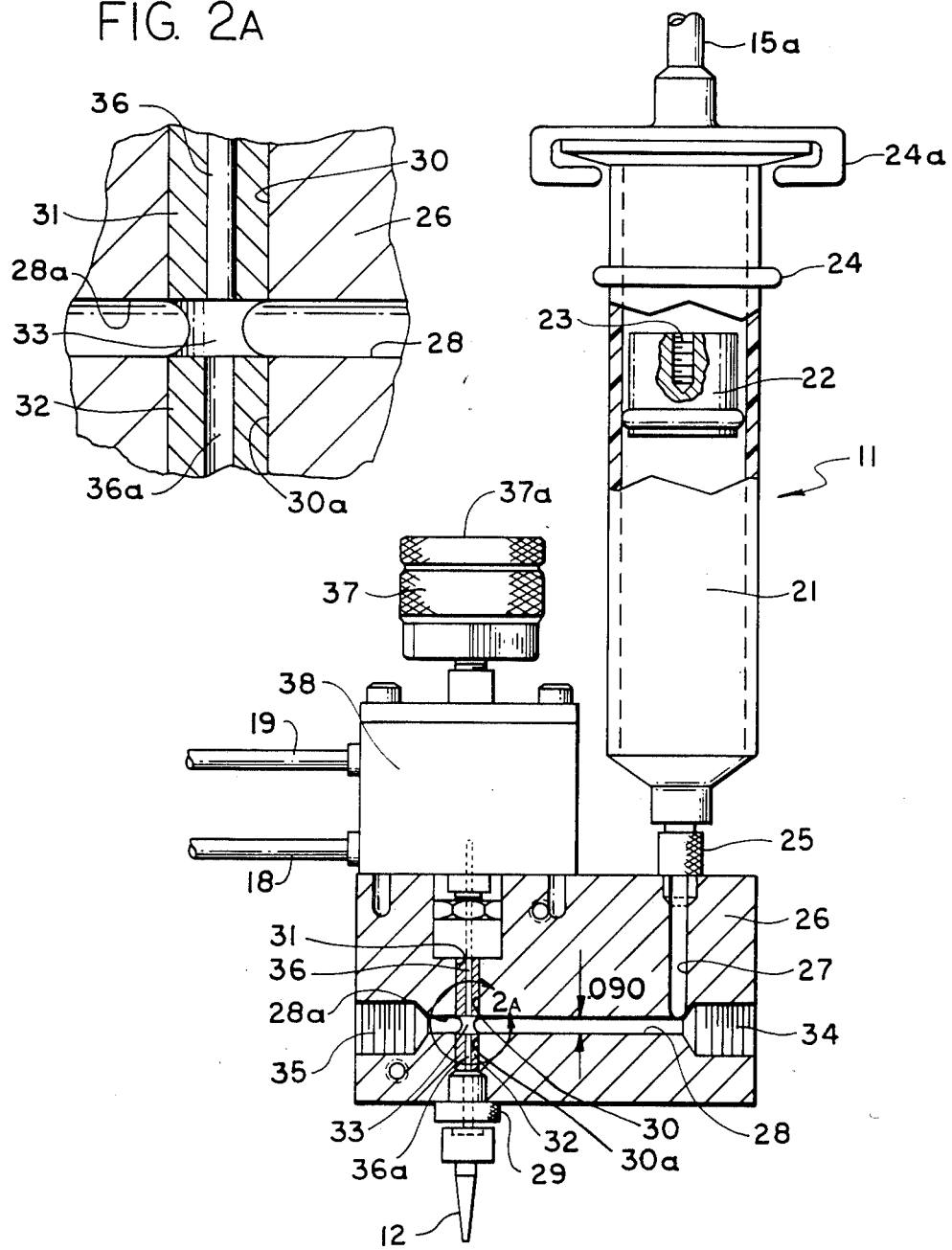
FIG. 2a is a further magnification of the portions of FIG. 2 identified by circle 2a on FIG. 2.

In the description following, references will be made to identification numerals appearing in FIG. 2, 2a and 3 as well as FIG. 1.

In addition to digitally programmed X and Y positioning, it is also known to provide digitally programmed Z axis clearance over the work surface as in the combination herein. In the environment of the present invention, the X and Y positioning program from programmer 10 is constructed to position the hypodermic needle 12 over a succession of conductive pad locations on the typical SMD circuit board as hereinbefore identified. During the dwell time over each selected conductive pad location, a Z axis program calls for vertical positioning of the needle tip during the X-Y dwell time. Suitable conductors 20 provide these X-Y-Z servo control electric signals to servo unit 11a which accomplishes corresponding positioning of the dispensing unit 11 as a unit (and therefore of needle 12).

In FIG. 2, the dispensing unit 11 is shown in detail. A syringe assembly 21 is shown with arbitrary mounting hardware 24 and 24a and a free piston 22 with "O" ring seal to the syringe inside bore. Steady (relatively low or reduced) air pressure via hose 15a is supplied from air supply 14 and is sufficient to drive piston 22 and therefore the solder/flux slurry in syringe 21 through fitting 25 and into passages 27 and 28. Element 26 is a block, preferably of metal shown sectioned to reveal the passages and other internal features. A pair of clean-outs 34 and 35 are threaded to receive plugs to seal the passages 28 and 28a during operation.

The solder/flux slurry forced through passages 27 and 28 by air driven piston 22 tends to fill an annular chamber 33 formed at the junction of pasages 28 and 30 between facing ends of drill bushings 31 and 32. A rod-like piston 36 fits with close sliding tolerance in drill bushings 31 and 32, these bushings press fitted into bores 30 and 30a in block 26. Piston (rod) 36 is shown in its retracted (up) position (see especially FIG. 2a) approximately at the top of the annular cavity 33. In its down position it passes into drill bushing 32 (position 36a on FIG. 2).

A "pancake" cylinder 38 of conventional type controls the throw of rod 36 when air pressure is applied through hoses 18 or 19 from electro-pneumatic controller 13 (see FIG. 1 also). Controller 13 is conventional and operates to apply the air pressure it receives at hose 17 from air supply 14 to either hose 18 (for up positioning of needle 12) or to hose 19 (for down positioning of needle 12) in response to corresponding electrical signals on lead 16.

Pancake cylinder 38 includes a two-sided piston or deflectable diaphragm connected to piston 36. Knurled knob 37 provides adjustment of the extent of piston 36 advance downward during operation (locked by nut 37a).

The passages 27 and 28 are larger than the bore in drill bushings 31 and 32 coupled at 29 to the needle 12, and the down stroke of piston 36 drives a discrete quantity of the slurry through drill bushing 32 and, therefore, out the orifice of needle 12. A typical vertical throw (up to down) of piston 36 would be equal to the vertical dimension of the annular volume 33 plus a nominal amount within bushing 32 in the embodiment described. Deposition of a typical volume of slurry of 0.1 to 2.0 microliters is achievable as a function of the maximum downward position of piston 36. Thus the dispenser 11 is properly referred to as a pumping valve, providing the advantages hereinbefore mentioned. A typical diameter for rod (piston) 36 can be 0.040 inches when the entire apparatus is scaled for the aforementioned SMD board slurry deposition.

Figure 3:
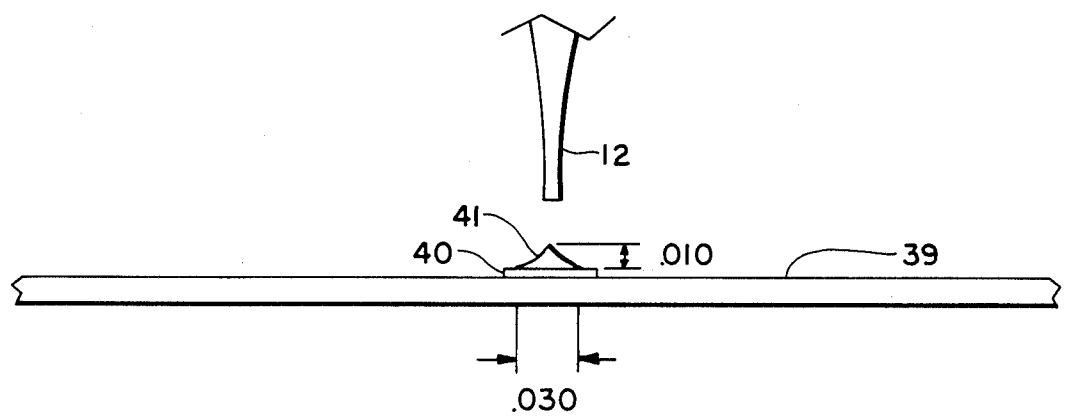
FIG. 3 illustrates a typical solder paste deposition on a conductive pad of a printed circuit board of the SMD type.

In FIG. 3, a typical circuit board 39 (illustrated on edge) has a typical conductive pad 40 onto which a cone of the slurry 41 is deposited. In a typical situation, this cone would form to 0.010 inches in height for a 0.030 inch base diameter due to the fluid sheer characteristic of the slurry. The pumping valve of the invention is capable of effective deposition of solder/flux slurry or other materials having viscosities between 10,000 and 2 million centipoise. Typical solder particle sizes in the 0.002 inch to 0.005 inch range within the flux material pose no operational impediment to uniform deposition of the slurry as depicted in FIG. 3.

The Z coordinate positioning of the dispenser assembly 11 should not be confused with the up-down travel of piston 36, that motion not affecting the vertical position of needle 12 vis-a-vis the surface of the board 39 on which the depositions of the slurry material are to be made. That Z coordinate motion occurs, as controlled in accordance with FIG. 1 within each discrete X-Y-Z position dictated by programmer 10 and is physically effected by servo unit 11a. The programmed Z position may vary if the surface of board 39 is not flat, or if pads 40 extend differently above the board surface. It will be under stood that X-Y-Z positioning can effect deposition of the viscous material on component parts or protrusions as well as on board surfaces as a function of X-Y-Z servo programming. The time of actual deposition is also controlled by programmer 10 via an electrical signal (up or down) on lead 16. A typical timing cycle for the operation of controller 13 (and therefore the motion of piston 36) would be 0.10 seconds "up", 0.05 seconds delay, and then 0.1 seconds "down". The conical shape of the deposition is completed during each "up" stroke of 36. In Z positioning, the needle 12 may be 0.1 inches (for example) above pad 40 for travel to a new X-Y position and typically 0.01 inches at the beginning of a new deposition, returning to its "up" position before termination of the deposition in each case. A threaded bore 23 in piston 22 facilitates insertion of a threaded rod to withdraw the piston for fluid recharging of the syringe 21. In addition to slurry materials homogeneous materials of viscosity hereinbefore mentioned may be dispensed or deposited.

Of course, it will be realized that the dispenser 11 of the described embodiment may be scaled up or down as required; however, one of its most significant advantages lies in deposition of the commercially available solder/flux slurry described herein before. For that application, the dimensional information given is particularly germane.

Various modifications within the scope of the invention will suggest themselves to those of skill in this art. Accordingly it is not intended that the scope of the invention be regarded as limited by the drawings presented or by this description.

Although not a part of the invention, it is noted that the melting of the solder and flux deposition is commonly accomplished with surface mounted components in place by means of "reflow" soldering employing a hot air stream at 600 degrees Fahrenheit. Other techniques are, of course, available including a hot probe programmed in X-Y and Z.

I claim:

1. A system for the deposition of a viscous fluid in small quantities at each of a plurality of X-Y-Z locations with respect to a surface, comprising:
   a dispensing device including an axially translating dispensing piston slideably located within a guiding passage ending in an orifice directed toward said surface;
   first means comprising a feed passage communicating laterally with said guiding passage, said feed passage having a greater cross-sectional area than that of said guiding passage;
   second means within said guiding passage comprising an enlargement of said guiding passage at the point of communication of said feed passage;

third means for supplying said viscous fluid to said enlargement under pressure through said feed passage; and fourth means for causing said piston to translate through and beyond said enlargement to effect ejection of a discrete quantity of said viscous fluid from the orifice of said needle.

2. A system according to claim 1 in which said orifice is at the end of a hypodermic type needle in communication with the end of said guiding passage nearest the end of said piston at its maximum translation through and beyond said enlargement.

3. A system according to claim 2 in which said viscous fluid is a slurry of soldering flux and solder particles.

4. A system according to claim 3 in which fifth means are included for programming X-Y location and the operation of said fourth means to control said dispensing device to make depositions at each of a number of predetermined locations on said surface.

5. A system according to claim 1 in which said viscous fluid is a slurry of soldering flux and solder particles.

6. A system according to claim 5 in which fifth means are included for programming X-Y location and the operation of said fourth means to control said dispensing device to make depositions at each of a number of predetermined locations on said surface.

7. A system according to claim 6 in which said fifth means comprises a digital computer and X, Y, Z coordinate servomechanisms responsive to said computer to effect successive location of said dispensing device according to a program associated with said computer.

8. A system according to claim 1 in which fifth means are included for programming X-Y location and the operation of said fourth means to control said dispensing device to make depositions at each of a number of predetermined locations on said surface.

9. A system according to claim 8 in which said fifth means comprises a digital computer and X,Y, and Z coordinate servomechanisms responsive to said computer to effect successive location of said dispensing device according to a program associated with said computer.

10. A system according to claim 8 in which said fourth means comprises a double-acting air cylinder connected to translate said dispensing piston "up" or "down" in accordance with activation of a corresponding pressurized air feed affecting a corresponding side of the piston of said double-acting air cylinder.

11. A system according to claim 10 further including a pneumatic controller responsive to said fifth means for applying air to a side of said dispensing piston corresponding to the programmed signal from said fifth means.

12. A system according to claim 1 in which said enlargement in said guiding passage is generally annular in shape, having a cross-sectional area greater than the cross-sectional area of said guiding passage and having a dimension along the axial centerline of said guiding passage at least equal to the diameter of said feed passage.

13. A system according to claim 1 in which said enlargement in said guiding passage is annular in shape having a cross-sectional diameter greater than that of said guiding passage and a dimension along the axial centerline of said guiding passage equal to the diameter of said feed passage.

14. A system according to claim 1 in which said third means comprises a syringe having an output connection and a free piston within, said viscous fluid being emplaced between said piston and said output connection, and a source of air under pressure applied to the other side of said piston.

15. A system according to claim 1 in which said fourth means comprises a double-acting air cylinder connected to translate said dispensing piston "up" or "down" in accordance with activation of a corresponding pressurized air feed affecting a corresponding side of the piston of said double-acting air cylinder.

16. A system according to claim 15 in which said double-acting air cylinder is a pancake cylinder in which the piston thereof is a deflectable diaphragm, center connected to said dispensing piston.

17. A system according to claim 15 in which said third means comprises a syringe having an output connection and a free piston within, said viscous fluid being emplaced between said piston and said output connection, and a source of air under pressure applied to the other side of said piston.

18. A system according to claim 1 in which said viscous fluid is homogeneous viscous fluid.

* * * * *